United States Patent
Liu et al.

[11] Patent Number: 6,163,052
[45] Date of Patent: Dec. 19, 2000

[54] TRENCH-GATED VERTICAL COMBINATION JFET AND MOSFET DEVICES

[75] Inventors: Yowjuang W. Liu, San Jose; Donald L. Wollesen, Saratoga, both of Calif.

[73] Assignee: Advanced Micro Devices, Inc., Sunnyvale, Calif.

[21] Appl. No.: 08/991,464

[22] Filed: Dec. 16, 1997

Related U.S. Application Data

[63] Continuation-in-part of application No. 08/832,657, Apr. 4, 1997.

[51] Int. Cl.[7] .......................... H01L 29/76; H01L 29/94; H01L 31/062; H01L 31/113
[52] U.S. Cl. .......................... 257/334; 257/330; 257/332; 257/302; 438/270
[58] Field of Search .................... 257/334, 332, 257/330, 302, 287; 438/212, 269, 270, 268

[56] References Cited

U.S. PATENT DOCUMENTS

| | | | |
|---|---|---|---|
| 4,827,321 | 5/1989 | Baliga | 357/37 |
| 4,914,739 | 4/1990 | Malhi | 357/23.6 |
| 4,967,243 | 10/1990 | Baliga et al. | 357/23.4 |
| 5,208,657 | 5/1993 | Chatterjee et al. | 257/302 |
| 5,225,697 | 7/1993 | Malhi et al. | 257/302 |
| 5,504,357 | 4/1996 | Kim et al. | 257/306 |
| 5,821,583 | 10/1998 | Hshieh et al. | 257/330 |
| 5,864,158 | 1/1999 | Liu et al. | 257/330 |
| 6,049,108 | 4/2000 | Williams et al. | 257/341 |
| 6,084,264 | 7/2000 | Darwish | 257/329 |

*Primary Examiner*—Tom Thomas
*Assistant Examiner*—Douglas W. Owens
*Attorney, Agent, or Firm*—Foley & Lardner

[57] ABSTRACT

A combination vertical MOSFET and JFET device (18,22) is formed in a mesa (20,24) of semiconductor material. A top gate (44,68) of the device is formed by creating a preferably annular trench (36,58) that extends downwardly from the surface of the semiconductor layer, creating a thin gate insulator (41,62) on the bottom and sidewalls of this trench, and filling the trench with highly doped polysilicon. A buried gate region (28,50) is formed by implanting the semiconductor layer, prior to top gate formation, such that the buried gate region is laterally coextensive with the mesa. An upper boundary (29,54) of the buried gate region is spaced below the bottom of the trench and spaced from the semiconductor surface. Upon application of a suitable voltage, the buried gate region and the top gate region coact to invert the conductivity type of the channel region, permitting transistor operation between the source region and the drain region.

13 Claims, 4 Drawing Sheets

TRENCH-GATED VERTICAL COMBINATION JFET AND MOSFET DEVICES

RELATED APPLICATIONS

This application is a continuation-in-part of U.S. application Ser. No. 08/832,657, filed Apr. 4, 1997, now pending, invented by the inventors hereof and owned by the assignee hereof. That application is fully incorporated by reference herein.

TECHNICAL FIELD OF THE INVENTION

The present invention relates in general to integrated circuits, and more particularly to a vertical combination junction field effect transistor (JFET) and "metal-oxide-semiconductor" field-effect transistor (MOSFET), and a method for fabricating same.

BACKGROUND OF THE INVENTION

In traditional semiconductor fabrication techniques, integrated circuit devices such as transistors are laid out in a relatively planar, thin film at the surface of a semiconductor substrate. As time has passed, there has been a need to make these devices smaller and smaller, such that they occupy less "real estate" on the surface of the semiconductor chip which they occupy.

As the dimensions of the device shrink, barriers to further downsizing begin to appear. For example, the depth of focus on small devices drops dramatically. One encounters line width control problems, alignment problems and problems with contacts. Squares become rounded in their shape; some features may disappear entirely with a loss of focus. Conventionally, the minimum size of a channel length of a transistor is determined by the minimum lithography obtainable by the stepper used to fabricate chips on the wafer. As the minimum channel length decreases, the cost of the stepper increases. A need therefore continues to exist to develop devices which occupy a small amount of real estate, whose critical dimensions are not controlled by lithographic constraints, and which at the same time have acceptable reliability, cost and operational performance.

SUMMARY OF THE INVENTION

The present invention relates to a combination MOSFET and JFET device having a transistor channel including a large portion which is formed to be approximately perpendicular to the surface of a substrate on which the device is formed. The length of this channel is therefore more independent of lithographic constraints. According to one aspect of the invention, a semiconductor layer is formed on the substrate to be of a first conductivity type. A buried gate region is formed in the semiconductor layer to be spaced from the surface of the semiconductor layer and to be of a second conductivity type. This buried gate region acts as a buried gate for the JFET formed by the device. A drain region is formed adjacent to the semiconductor layer surface and is spaced from an upper boundary of the buried gate region by a portion of a channel region.

A conductive top gate is formed in a hole, such as a trench, which extends downward from the semiconductor surface. The top gate is insulatively spaced from the channel region, as by means of a gate insulator formed on the sidewalls and bottom of the trench. The bottom of the trench is spaced upwardly from the upper boundary of the buried gate region. The trench is interposed between a source region, formed to be of the second conductivity type and the surface of the semiconductor layer, from the drain region. The channel region formed between the source region and the drain region comprises three portions in ohmic communication with each other: a first vertical portion extending downward from the drain region; a second vertical region extending downward from the source region; and a lateral portion connecting the first two portions together, and disposed between the bottom of the hole or trench and the upper boundary of the buried gate region.

The device acts as a MOSFET in creating (where the first conductivity type is (n)) an n-channel in the channel region all of the way around the hole or trench from the drain region to the source region, as influenced by a voltage applied to the top gate. The device acts as a JFET in having the buried gate control the conductivity of the channel region in the vicinity of the trench bottom. Preferably, an ohmic connection is supplied to the buried gate region through a buried gate connector region that is formed to extend from the surface of the semiconductor layer to the boundary of the buried gate region.

In one embodiment of the invention, the conductive top gate, which for example can be highly doped polysilicon, is formed as a ring or other endless structure to surround that portion of the semiconductor layer that includes the source region. The buried gate connector region is formed laterally exterior to a trench containing the gate.

This device is preferably built as a mesa of semiconductor material on a substrate insulator (SOI); in one embodiment, a second, complementary device having reversed conductivity types for its components is built in another mesa. The mesas are separated from each other and from other devices by an insulator such as oxide. In a further variation, the device may be built to comprise a normally-on JFET, in which the surface source and drain regions are of the same conductivity type as the channel region. The buried gate region, which is of opposite conductivity type with respect to the channel region, is used to selectively pinch off the channel region.

The device of the invention has many technical advantages. There is no hot carrier injection concern, as the channel region conducts current in bulk in its body rather along its surface. The voltage distribution is more uniform. A higher performance is obtained because the horizontal area of the drain and source region is the same as the cross-sectional area of the channel region, making the effective transistor size larger. The channel length is not controlled exclusively by lithography, and thus a channel length of less than L can be obtained, where L is the minimum lithographic feature dimension. This channel region can instead be controlled by diffusion, implanting and etching. The device of the invention has much better reliability than conventional devices, as its voltage distribution is much better and there is no localized high electric field. The device is easier to scale and, because an advanced stepper is not needed, results in reduced manufacturing costs.

BRIEF DESCRIPTION OF THE DRAWINGS

Further aspects of the invention and their technical advantages will be discerned with reference to the following detailed description when taken in conjunction with the drawings in which.

DETAILED DESCRIPTION OF THE INVENTION

Figure 1:
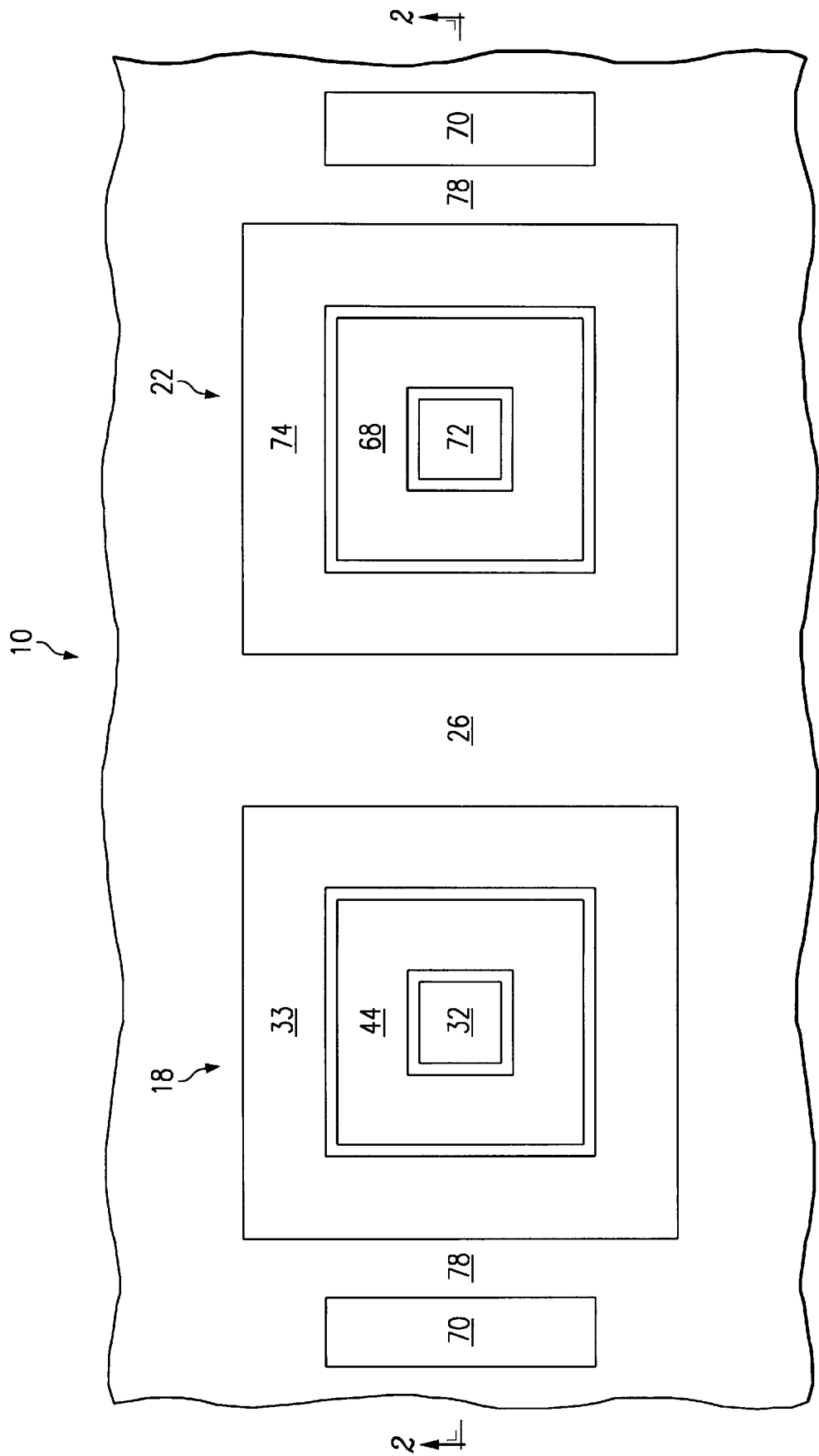
FIG. 1 is a highly magnified schematic top view of a trench-gated vertical combination JFET and MOSFET device according to the invention.
Figure 2:
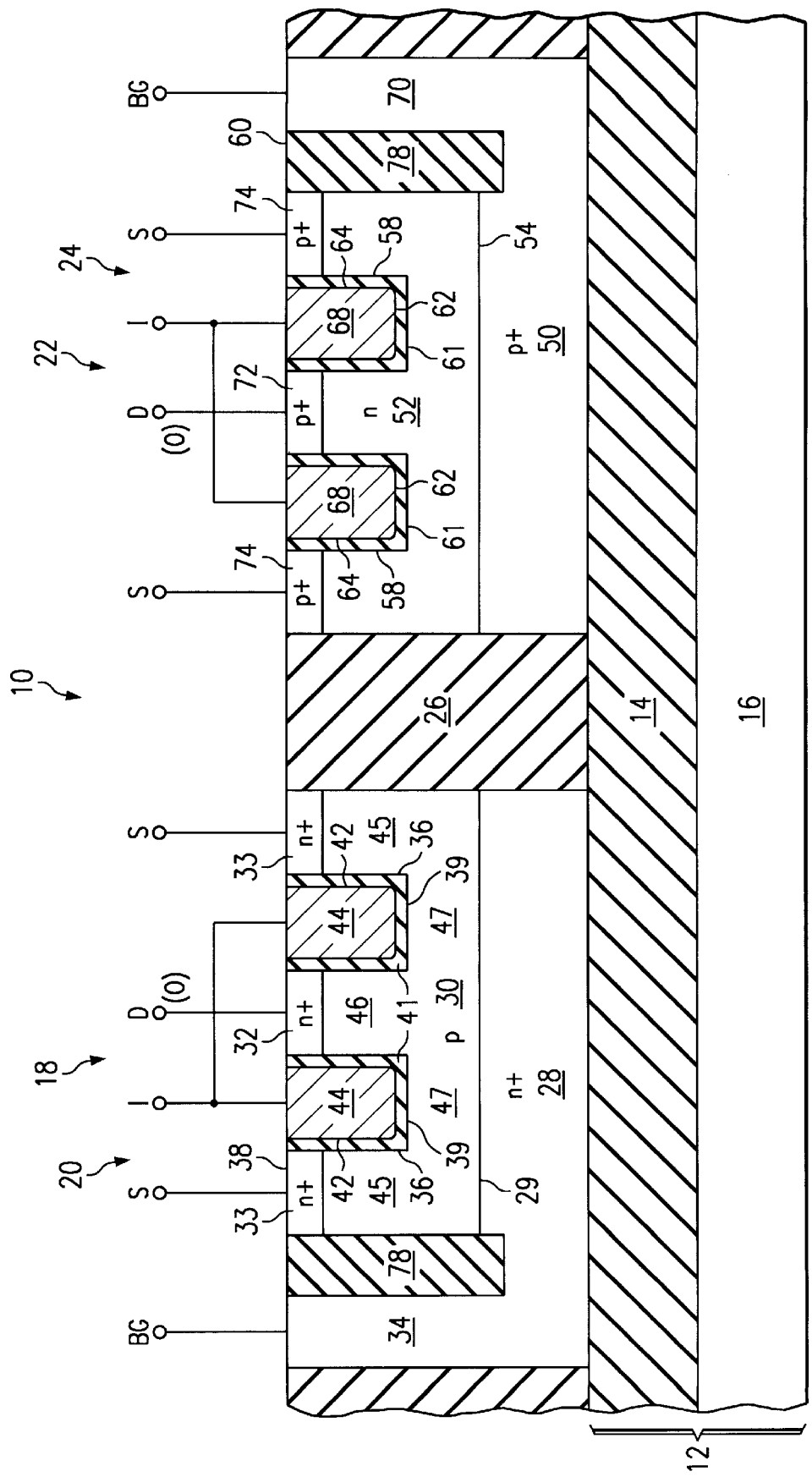
FIG. 2 is a schematic cross-sectional view of the device shown in FIG. 1, taken substantially along line 2—2 of FIG. 1.

With reference to FIGS. 1 and 2, a complementary metal-oxide-semiconductor (CMOS) version of the invention is indicated generally at 10. Device 10 is formed on a substrate 12, which preferably includes a layer 14 of oxide that has been formed on a silicon base 16. Alternatively, the substrate 12 can be undoped or doped bulk silicon or other semiconductor layer. The described embodiment uses silicon as the semiconductor, but other semiconductor materials such as gallium arsenide can be used.

Preferably, the device is composed of an n-channel field effect transistor coupled with a JFET, indicated generally at 18, and formed in a first semiconductor layer or mesa 20, and a second, p-channel field effect transistor as coupled with a JFET 22 formed in a second semiconductor layer or mesa 24. Mesas 20 and 24 are spaced apart by insulator or isolation regions 26, which may be formed of oxide. Thus, transistors 18 and 22 are completely isolated from each other and other semiconductor devices in all directions. Isolation trenches 78 are formed to isolate the buried gate connection from the drain connection. These are deep enough to extend beyond boundary 29 of the (p) layer. Initially or later, mesa 20 is lightly doped to be (p−), and mesa 24 is lightly doped to be (n−).

Device 18 includes a heavily doped (n+) buried gate region 28 that preferably extends the entire width of the mesa 20. An upper boundary 29 of region 28 is spaced away from a top surface 38 of the mesa 20. A channel region 30 is disposed adjacent boundary 29 and spaces region 28 from an (n+) surface drain region 32 and an (n+) surface source region 33. A (n+) buried gate connector region 34 extends from the top surface 38 to at least boundary 29 and is isolated from source region 33 by the oxide-filled trench 78.

A preferably endless or ring-shaped trench 36 extends from the top surface 38 of the mesa 20 downward, such that a bottom 39 of the trench 36 is spaced upwardly from the upper boundary 29 of buried gate region 28. A gate insulator layer 41, which for example can be oxide, nitrided oxide or an oxide-nitride-oxide sandwich, is grown on the bottom 39 and sidewalls 42 of the trench 36.

A conductive top gate 44, which is preferably formed of highly doped polycrystalline silicon (poly), is formed within that volume of trench 36 which is left over from the formation of the gate insulator 41. An (n+) drain region 32 is formed as by implantation of (n) type dopant to be adjacent surface 38 and to be spaced from source region 28 by channel region 30. The source region 33 can be formed at the same time as drain region 32. In the embodiment illustrated in FIGS. 1 and 2, the surface source region 33 is endless or ring-shaped, while drain region 32 is laterally surrounded by trench 36.

The channel region 30 has three interconnected subregions: a vertical subregion 45 spacing apart source region 33 from buried gate region 28, and occupying a volume external to the trench 36; a vertical subregion 46, spacing apart drain region 32 from buried gate region 28, and disposed inwardly of endless trench 36; and a lateral subregion 47 which is disposed between trench bottom 39 and buried gate region boundary 29, and ohmically connecting vertical subregions 45 and 46.

The p-channel device 22 is essentially the reverse of the n-channel transistor 18. The p-channel transistor has a highly doped (p+) buried gate region 50 with an upper boundary 54 that is spaced from a top surface 60 of the semiconductor mesa 24. An (n−) channel region 52 is disposed above buried gate region 50. An endless or ring-shaped trench 58 is patterned and etched to extend from the top surface 60 of the mesa 24 downwardly, such that a bottom 61 of the trench 58 is spaced upwardly from upper boundary 54 of buried gate region 50. A gate insulator 62 is formed on the bottom 61 and sidewalls 64 of the trench 58. A second conductive (preferably highly doped polysilicon) top gate 68 is formed within the volume left over by the gate insulator 62 inside the trench 58. A (p+) buried gate connector region 70 is formed so as to extend from the surface 60 of the semiconductor layer 24 to at least the boundary 54 of the buried gate region 50, so as to provide an ohmic contact to this buried gate region from the surface. Buried gate connector region 70 is isolated from source region 74 by oxide-filled trench 78. A (p+) drain region 72 is formed at the surface 60 of the semiconductor 24, along with a (p+) source region 74. While the p-channel transistor 22 is schematically shown to be of the same size as the n-channel transistor 18, in actual practice the channel region 52 of transistor 22 will usually be dimensioned to be larger than n-channel transistor 18 to have the same current-carrying capacity.

The electrical contacts made to the various semiconductor regions forming transistors 18 and 22 are shown schematically in FIG. 2. As assembled into a CMOS/JFET gate, a voltage Vdd is connected to the source region 74 of p-channel transistor 22, an input I is connected to the poly gates 44 and 68, and respective buried gate connector regions 34 and 70, of devices 18 and 22, and an output O is connected to drain region 72 of p-channel transistor 22 and to drain 32 of the n-channel transistor 18. A source voltage Vss is connected to source region 33 of n-channel transistor 18.

Figure 3:
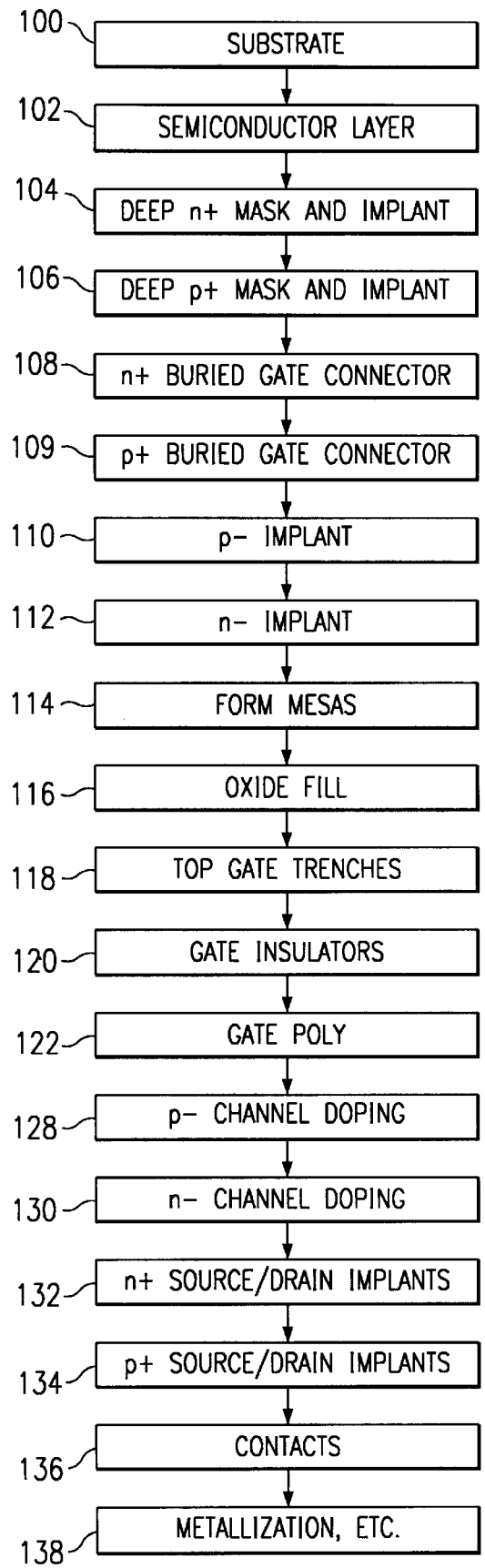
FIG. 3 is a representative process flow diagram for the construction of the device shown in FIGS. 1 and 2.

A representative process for fabricating device 10 is illustrated in the flow diagram of FIG. 3. At a step 100, a substrate is provided. The substrate can be a conventional semiconductor substrate or, as illustrated in FIG. 2, can be a substrate including an oxide or quartz layer 14 on top of a semiconductor layer 16.

At step 102, a semiconductor layer is formed on the oxide layer 14. At step 104, an (n+) implant is performed through a mask to create (n+) buried gate region 28. At step 106, the (n+) source region 28 is covered while a deep (p+) implant is performed on the semiconductor layer to create (p+) buried gate region 50. After these two implants, a diffusion drive-in can be performed after step 106.

At step 108, a buried gate connector mask is applied to the workpiece and an (n+) implant performed at a relatively high energy and high dose to create the (n+) buried gate connector region 34 (FIG. 2). Similarly, at step 109, a further relatively high energy and high dose implant is performed to create (p+) buried gate connector region 70. After step 109, a further diffusion drive-in step can be performed.

At step 110, the semiconductor layer is masked and a (p−) implant is performed in that region of the semiconductor layer that will form the (n−) channel transistor 18. This mask is then removed, and at step 112 a similar (n−) implant is performed on that portion of the semiconductor layer forming p-channel transistor 22.

At step 114, the semiconductor layer is patterned and etched to form mesas 20 and 24, such that islands of semiconductor are isolated from each other by an isolation channel. Source/buried gate isolation trenches 78 are also formed during this step. This may be accomplished, for example, by performing a timed etch until the desired depth of the trenches 78 is reached. The trenches 78 may then be masked and the etch continued until the mesas of semiconductor material become separated.

At step 116, an insulator such as oxide is deposited to form regions 26 that isolate the mesas 20 and 24 from each other and from other structures which may be fabricated on the substrate, and to fill trenches 78.

At step 118, endless or ring-shaped trenches 36 and 58 are patterned and anisotropically etched in a timed etch so as to extend downwardly, but only such that there bottoms 39 and 61 are upwardly spaced from upper boundaries 29 and 54 of the respective (n+) and (p+) buried gate regions 28 and 50 (see FIG. 2). Once trenches 36 and 58 are formed, at step 120 gate insulators 41 and 62 are grown on the bottoms 39 and 61 of the trenches and on the sidewalls 42 and 64 thereof. The gate insulators may be straight oxide, nitrided oxide or may be formed of a trilayer of oxide, nitride and oxide for increased reliability. At step 122, poly is deposited across the face of the workpiece so as to fill the trenches 36 and 58. The excess poly may be removed by chemical/mechanical polishing (CMP) to produce a planar top surface of the structure and separated ring-shaped transistor top gates 44 and 68.

At step 128, one or more masked implants are performed on the p-channel region 52, such as a threshold voltage adjust implant and a punch-through prevention implant. Similarly, Vt adjust and punch-through prevention implants are performed on the n-channel region 30 at step 130. At step 132, a source/drain implant is performed with an (n) type dopant to create (n+) drain 32 as well as (n+) source region 33. At step 134, a similar (p) source/drain implant is performed to create (p+) drain 72 and (p+) source region 74. Both of these source/drain implant steps are performed through appropriate masks.

At step 136, contacts are made to surface source region 46, drain 32, gate 44, surface source region 74, drain 72 and gate 68. Finally, at step 138, appropriate metallization and passivation steps are carried out to complete the semiconductor device.

FIG. 3 illustrates only one possible fabrication method, and FIGS. 1 and 2 illustrate only one possible embodiment of the invention. In an alternative embodiment, a semiconductor layer may be formed on the oxide layer 14, and an epitaxial layer formed on the buried semiconductor layer. The base or buried semiconductor layer may be highly doped in order to create the buried gate regions as shown prior to the growth of the subsequent epitaxial layer.

Figure 4:
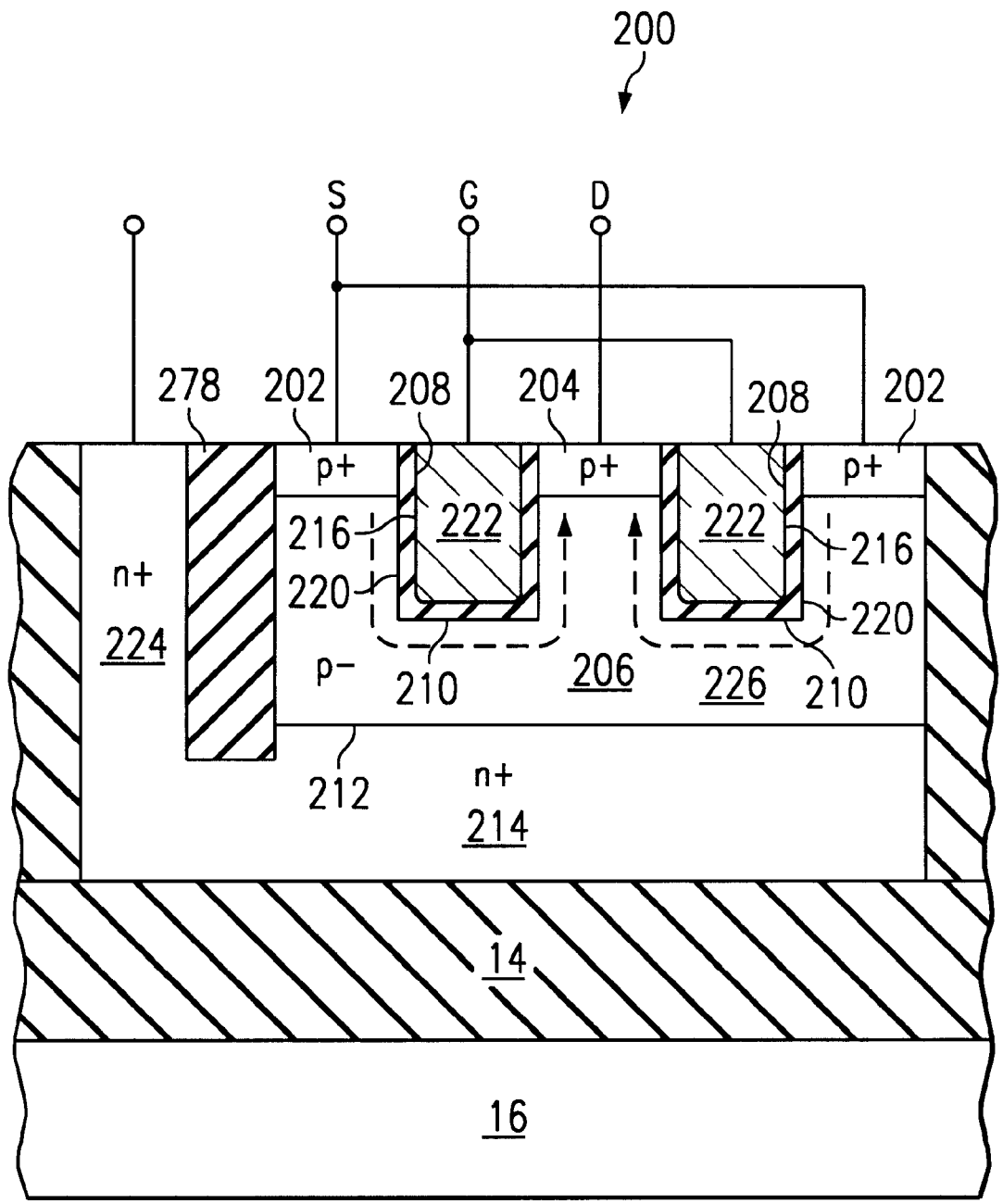
FIG. 4 is a high magnified schematic cross-sectional view of an alternative embodiment of the invention.

A further embodiment of the invention is illustrated in FIG. 4, which is a schematic sectional view of a normally-on JFET 200.

In this embodiment, there is normally no pn junction between the (p+) source region 202 and the (p+) drain region 204; the communicating channel region 206 is lightly doped to be (p) type. Similar to the embodiment shown in FIGS. 1 and 2, an annular trench 208 is formed such that a bottom 210 of trench 208 is spaced above an upper boundary 212 of an (n+) buried gate region 214.

A gate insulator 216 of one of the previously mentioned types is formed on the bottom 210 and sidewalls 220 of the trench 208, and a conductive material is placed in the remaining trench volume to form a conductive top gate 222.

In operation, channel region 206 will normally conduct between source region 202 and drain region 204. Upon application of sufficient voltage to buried gate connector region 224, more and more of normally-on horizontal channel subregion 226 will be inverted in conductivity, until "pinchoff" against trench 208 is achieved. The device 200 will then be turned off. A linear region of operation may be achieved by regulating the voltages applied to buried gate region 214 and top gate 222 to control the cross-sectional area of horizontal channel subregion 226.

In a further embodiment (not shown), a LOCOS process may be used in place of trenched oxide isolation regions 26.

In summary, a vertical-channel SOI MOSFET device coupled with a JFET device has been shown and described. The device exhibits bulk conduction, more uniform voltage distribution and a channel length which is not directly limited by lithography.

While a preferred embodiment of the invention has been described in the detailed description and illustrated in the accompanying drawings, the invention is not limited thereto but only by the scope and spirit of the appended claims.

What is claimed is:

1. A vertical combination MOSFET and JFET device, comprising:

a substrate;

a semiconductor layer formed on said substrate to be of a first conductivity type and having a surface;

a buried gate region formed in said semiconductor layer to be spaced from said surface of said semiconductor layer and to be of a second conductivity type opposite said first conductivity type, said buried gate region having a boundary, a channel region of said device at least partly disposed adjacent to said boundary of said buried gate region;

a drain region formed adjacent said surface of said semiconductor layer to be spaced from said buried gate region by said channel region and to be of said second conductivity type;

a trench formed to extend downwardly from said surface of said semiconductor layer and having sidewalls, a bottom of said trench spaced above said boundary of said buried gate region;

a gate insulator formed to adjoin said sidewalls and said bottom of said trench;

a conductive top gate formed in said trench;

a source region formed at said surface of said semiconductor layer to be insulatively spaced from said drain region, said channel region extending from said source region to said drain region and disposed adjacent at least one of said sidewalls and adjacent said bottom of said trench, said channel region interposed between said drain region and said buried gate region, said channel region further interposed between said source region and said buried gate region; and means for impressing a buried gate voltage on said buried gate region.

2. The device of claim 1, wherein said sidewall is endless, said top gate laterally surrounding said drain region.

3. The device of claim 1, wherein said means for impressing said buried gate voltage on said buried gate region is a buried gate connector region formed in said semiconductor layer to be of said second conductivity type and extending from said surface of said semiconductor layer to said boundary of said buried gate region.

4. The device of claim 1, wherein said substrate comprises an insulator.

5. The device of claim 1, wherein said top gate is highly doped polycrystalline silicon.

6. The device of claim 1, wherein said substrate includes a dielectric layer disposed adjacent to said buried gate region.

7. The device of claim 1, wherein said semiconductor layer is formed as a mesa of semiconductor material.

8. The device of claim 7, wherein said mesa has sidewalls, said mesa being laterally isolated by regions of dielectric material disposed adjacent said sidewalls of said mesa.

9. A complementary combination vertical MOSFET and JFET device, comprising:

a substrate;

a first semiconductor layer formed on a first area of said substrate to be of a first conductivity type and having a top surface;

a first buried gate region formed in said first semiconductor layer to have an upper boundary spaced from said top surface of said first semiconductor layer and to be of a second conductivity type opposite said first conductivity type, a first channel region of said first semiconductor layer formed to be of said first conductivity type and adjacent said first buried gate region;

a first drain region formed in said first semiconductor layer adjacent said top surface of said first semiconductor layer and to be spaced from said buried gate region of said first semiconductor layer by said first channel region, said first drain region formed to be of said second conductivity type;

a first source region formed adjacent said top surface of said first semiconductor layer and to be of said second conductivity type;

a first trench formed to extend downwardly from said top surface of said first semiconductor layer into said channel region, a bottom of said first trench spaced above said upper boundary of said first buried gate region, said first trench having at least one sidewall and laterally spacing said first drain region from said first source region;

a first gate insulator formed on said at least one sidewall;

a first conductive top gate formed in said first trench adjacent said sidewall and insulatively adjacent said first channel region;

a second semiconductor layer formed on a second area of said substrate to be of said second conductivity type and having a top surface;

a second buried gate region formed in said second semiconductor layer to be of said first conductivity type, an upper boundary of said second buried gate region spaced from said top surface of said second semiconductor layer, a second channel region of said second semiconductor layer having said second conductivity type;

a second drain region formed adjacent said top surface of said second semiconductor layer and to be spaced from said second buried gate region by said second channel region and to be of said first conductivity type;

a second trench formed from said top surface of said second semiconductor layer and extending downwardly into said second channel region, said second trench having at least one sidewall, a bottom of said trench spaced from said upper boundary of said second buried gate region;

a second gate insulator formed on said at least one sidewall and said bottom of said second trench;

a second conductive top gate formed in said second trench;

means for impressing a drain voltage on said first drain region;

means for impressing a source voltage on said second buried gate region;

means for conductively coupling together said first buried gate region with said second drain region; and means for conductively coupling together said first and second top gates.

10. The device of claim 9, wherein said means for impressing a source voltage on said second buried gate region comprises a second buried gate connector region extending from said top surface of said second semiconductor layer to said second buried gate region, said second buried gate connector region being of said first conductivity type.

11. The device of claim 9, wherein said means for conductively coupling said first buried gate region with said second drain region comprises a first buried gate connector region formed in said first semiconductor layer to be of said second conductivity type and to extend from at least said upper boundary of said first buried gate region to said top surface of said first semiconductor layer.

12. The device of claim 9, wherein said first semiconductor layer is formed in a first mesa, said second semiconductor layer being formed in a second mesa spaced from said first mesa.

13. A vertical combination MOSFET and JFET device, comprising:

a substrate;

a semiconductor layer formed on said substrate to be of a first conductivity type and having a surface;

a buried gate region formed in said semiconductor layer to be spaced from said surface of said semiconductor layer and to be of a second conductivity type opposite said first conductivity type, said buried gate region having a boundary, a channel region of said device formed to be of said first conductivity type and to be at least partly disposed adjacent to said boundary of said buried gate region;

a drain region formed adjacent said surface of said semiconductor layer to be spaced from said buried gate region by said channel region and to be of said first conductivity type;

a trench formed to extend downwardly from said surface of said semiconductor layer and having sidewalls, a bottom of said trench spaced above said boundary of said buried gate region;

a gate insulator formed to adjoin said sidewalls and said bottom of said trench;

a conductive top gate formed in said trench;

a source region of said first conductivity type formed at said surface of said semiconductor layer to be insulatively spaced from said drain region, said channel region extending from said source region to said drain region and disposed adjacent at least one of said sidewalls and adjacent said bottom of said trench, said channel region interposed between said drain region and said buried gate region, said channel region further interposed between said source region and said buried gate region; and means for impressing a buried gate voltage on said buried gate region.

* * * * *